United States Patent
Youk et al.

(10) Patent No.: US 11,008,656 B2
(45) Date of Patent: May 18, 2021

(54) ROLL TO ROLL FABRICATION APPARATUS FOR PREVENTING THERMAL IMPACT

(71) Applicant: LG DISPLAY CO., LTD., Seoul (KR)

(72) Inventors: Seunghyun Youk, Paju-si (KR); Yunho Kook, Paju-si (KR); Sungwoo Choi, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/812,767

(22) Filed: Nov. 14, 2017

(65) Prior Publication Data

US 2018/0148843 A1 May 31, 2018

(30) Foreign Application Priority Data

Nov. 28, 2016 (KR) .................. 10-2016-0159702

(51) Int. Cl.
*C23C 16/54* (2006.01)
*C23C 16/46* (2006.01)
*H01J 37/32* (2006.01)
*H01L 31/20* (2006.01)
*H01L 51/56* (2006.01)
*C23C 16/02* (2006.01)
*H01L 27/12* (2006.01)
*H01L 27/32* (2006.01)

(52) U.S. Cl.
CPC ........ *C23C 16/545* (2013.01); *C23C 16/0245* (2013.01); *C23C 16/46* (2013.01); *H01J 37/3277* (2013.01); *H01L 27/1262* (2013.01); *H01L 31/206* (2013.01); *H01L 51/56* (2013.01); *H01J 2237/2065* (2013.01); *H01J 2237/3321* (2013.01); *H01J 2237/3328* (2013.01); *H01L 27/3262* (2013.01)

(58) Field of Classification Search
None
See application file for complete search history.

(56) References Cited

U.S. PATENT DOCUMENTS

| | | | |
|---|---|---|---|
| 4,485,125 A | 11/1984 | Izu et al. | |
| 4,492,181 A | * 1/1985 | Ovshinsky | ............ C23C 16/505 118/718 |

(Continued)

FOREIGN PATENT DOCUMENTS

| | | |
|---|---|---|
| CN | 101629283 A | 1/2010 |
| CN | 102758190 A | 10/2012 |

(Continued)

*Primary Examiner* — Karla A Moore
(74) *Attorney, Agent, or Firm* — Seed IP Law Group LLP

(57) ABSTRACT

A roll to roll fabrication apparatus includes: a vacuum chamber having an installation chamber and a process chamber; a preprocessing unit in the installation chamber to process a surface of a film which is transferred to enhance a film characteristic in a subsequent CVD process; a process drum in the process chamber to wind the film thereon; a process treatment unit in the process chamber to form a layer by performing a CVD process on the film wound on the process drum; and a plurality of heaters in the installation chamber and the process chamber to gradually increase a temperature of the film wound on the process drum to prevent application of a thermal impact to the film due to the high-temperature process drum.

6 Claims, 6 Drawing Sheets

(56) References Cited

U.S. PATENT DOCUMENTS

| | | | | |
|---|---|---|---|---|
| 4,655,168 | A | * | 4/1987 | Shimozato ............ C23C 14/562 |
| | | | | 118/718 |
| 5,411,591 | A | * | 5/1995 | Izu ........................ B65D 65/42 |
| | | | | 118/718 |
| 2002/0122896 | A1 | * | 9/2002 | Kim ........................ A61L 2/14 |
| | | | | 427/569 |
| 2006/0159844 | A1 | | 7/2006 | Moriwaki et al. |
| 2007/0224348 | A1 | * | 9/2007 | Dickey ............. C23C 16/45551 |
| | | | | 427/248.1 |
| 2011/0262641 | A1 | | 10/2011 | Sferlazzo et al. |
| 2012/0240854 | A1 | * | 9/2012 | Hayakawa ............... B05D 1/60 |
| | | | | 118/719 |
| 2012/0273459 | A1 | * | 11/2012 | Lee ....................... C23C 14/562 |
| | | | | 216/41 |
| 2013/0089665 | A1 | * | 4/2013 | Takenaka .......... C23C 16/45551 |
| | | | | 427/248.1 |
| 2014/0290861 | A1 | * | 10/2014 | Dieguez-Campo ......................... |
| | | | | C23C 14/562 |
| | | | | 156/345.31 |

FOREIGN PATENT DOCUMENTS

| | | | |
|---|---|---|---|
| CN | 104692169 | A | 6/2015 |
| CN | 105247100 | A | 1/2016 |
| EP | 0 782 176 | A2 | 7/1997 |
| EP | 2 466 646 | A1 | 6/2012 |
| EP | 2 518 762 | A1 | 10/2012 |

* cited by examiner

ROLL TO ROLL FABRICATION APPARATUS FOR PREVENTING THERMAL IMPACT

CROSS-REFERENCE TO RELATED APPLICATION

Pursuant to 35 U.S.C. § 119(a), this application claims the benefit of an earlier filing date of and the right of priority to Korean Application No. 10-2016-0159702, filed on Nov. 28, 2016, the contents of which are incorporated by reference herein in its entirety.

BACKGROUND

Technical Field

This specification relates to a roll to roll fabrication apparatus capable of performing processes rapidly and consecutively, and capable of preventing a thermal impact from being applied to a ductile substrate.

Description of the Related Art

Recently, a flexible display device using a ductile substrate such as a plastic substrate is being developed for enhanced portability and convenience. Such a flexible display device is fabricated in a following manner. Firstly, a substrate formed of a plastic material such as polyimide is attached onto a mother substrate formed of glass. Then, a plurality of display panels are formed on the mother substrate through various processes including a TFT process, then the mother substrate is cut in units of the display panels, and the plastic substrate is separated from the mother substrate.

However, the conventional method to fabricate such a flexible display device has the following problems.

Recently, research is actively ongoing to reduce fabrication costs of an expensive display device by fabricating the display device through a consecutive inline process. However, in case of attaching a plastic substrate onto a glass mother substrate, the expensive glass substrate of a large area is required. This may cause fabrication costs to be increased, and equipment and processes to be additionally required since the plastic substrate and the glass substrate should be attached to each other and then separated from each other. As a result, entire fabrication costs are increased.

Further, processes are performed on a single unit of the mother substrate, even if a plurality of display panels are formed on the large mother glass substrate. As a result, a consecutive inline process cannot be performed.

BRIEF SUMMARY

Therefore, an aspect of the detailed description is to provide a roll to roll fabrication apparatus capable of performing an inline process rapidly and consecutively, by forming display panels on a film which is transferred between rolls.

Another aspect of the detailed description is to provide a roll to roll fabrication apparatus capable of preventing occurrence of wrinkles on a film, due to a thermal impact applied to the film from a process drum, by gradually increasing a temperature of the film wound on the high-temperature process drum.

To achieve these and other advantages and in accordance with the purpose of this specification, as embodied and broadly described herein, there is provided a roll to roll fabrication apparatus, including: a vacuum chamber having an installation chamber and a process chamber. A preprocessing unit is disposed in the installation chamber, and is configured to process a surface of a film which is transferred to enhance a film characteristic in a subsequent CVD process. A process drum is disposed at the process chamber, and is configured to wind the film thereon. A process treatment unit is disposed at the process chamber, and is configured to form a layer by performing a CVD process on the film wound on the process drum.

A plurality of heaters are disposed at the installation chamber and the process chamber, and are configured to gradually increase a temperature of the film wound on the process drum to thus prevent application of a thermal impact to the film due to the high-temperature process drum. The heater may be installed in the installation chamber in one or plurality, and may be installed in the process chamber in plurality.

The preprocessing unit of the installation chamber processes a surface of the film by plasma gas. A first vacuum pump and a second vacuum pump are provided at the installation chamber and the process chamber, respectively, such that preprocessing plasma gas flows only in the installation chamber, without being introduced to the process chamber. This may prevent an inferior CVD process resulting from mixing of preprocessing plasma gas with plasma gas for CVD.

In the roll to roll fabrication apparatus of the present disclosure, all processes may be consecutive inline roll to roll processes, each of the roll to roll processes being connected to a previous process and a next process. In this case, the installation chamber includes: an inlet through which the film transferred from a previous process region is input in real time; and an outlet through which the film having undergone a process is output to a next process region in real time.

In the roll to roll fabrication apparatus according to the present disclosure, only a corresponding process may be a roll to roll process which is disconnected from a previous process and a next process. In this case, the installation chamber includes: a film supplying roll for supplying a film to the process chamber; a film collecting roll for collecting the film transferred from the process chamber; a protection film separating roll for separating a protection film attached to the film; a protection film collecting roll for collecting the separated protection film; a protection film supplying roll for supplying a protection film to the film transferred from the process chamber; and a protection film attaching roll for attaching the supplied protection film to the film.

Effects of the Present Disclosure

In the present disclosure, the film is wound on the high-temperature process drum, after having its temperature gradually increased by the plurality of heaters. This greatly reduces thermal impact to the film, thereby preventing occurrence of wrinkles on the film due to such a thermal impact.

Moreover, the first vacuum pump and the second vacuum pump are provided at the installation chamber and the process chamber, respectively, such that preprocessing plasma gas supplied to the installation chamber is not introduced to the process chamber, but is discharged to the outside only through the first vacuum pump. As preprocessing plasma gas is not mixed with processing plasma gas, an inferior film due to gas mixing may be prevented.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION

Hereinafter, the present disclosure will be explained in more detail with reference to the attached drawings.

In the present disclosure, a flexible display device is fabricated in a manner that does not rely on a ductile substrate such as a plastic substrate is attached onto a mother substrate formed of glass, but rather in a roll to roll manner. That is, the flexible display device is fabricated by implementing a plastic ductile substrate in the form of a film, by winding the film on two rolls, and then by transferring the film between the rolls.

Since processes to attach a ductile substrate onto an expensive glass mother substrate and to separate the ductile substrate from the glass mother substrate are not required in the present disclosure, fabrication costs may be reduced and fabrication processes may be simplified. Further, since the fabrication processes can be performed while a film is being consecutively transferred, an inline process can be rapidly performed in a narrow space.

Hereinafter, the roll to roll fabrication apparatus according to the present disclosure will be explained by taking a specific display device as an example. However, the roll to roll fabrication apparatus according to the present disclosure may be applicable to all types of display device as well as such a specific display device. Further, the roll to roll fabrication apparatus according to the present disclosure may be applicable to all devices, even those which use or form a metallic pattern, such as a lighting apparatus including an organic light emitting device.

Figure 1:
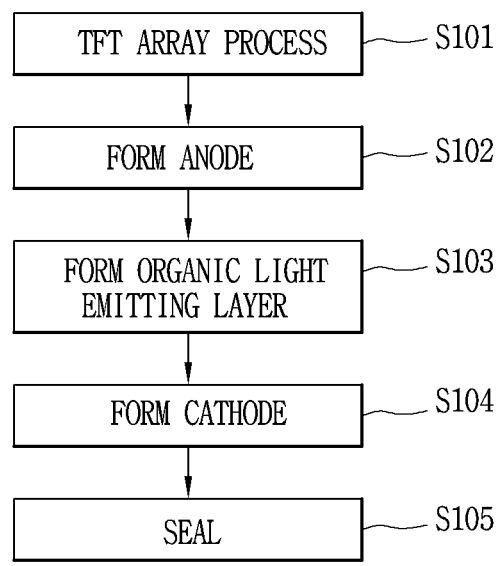
FIG. 1 is a flowchart showing a method for fabricating an organic electroluminescent device.

FIG. 1 is a flowchart schematically showing a method for fabricating a flexible organic electroluminescent device.

As shown in FIG. 1, a plurality of gate lines and data lines which define pixel regions are formed on a film where display panels are formed in a single row or a plurality of rows, in a lengthwise direction. A thin film transistor (TFT), a driving device connected to the gate line and the data line, is formed at each pixel region (S101). Then, a transparent metallic oxide such as Indium Tin Oxide (ITO) or Indium Zinc Oxide (IZO) is laminated on each pixel region and is etched, thereby forming an anode (S102). Then, an organic light emitting material is deposited on the entire display panels, thereby forming an organic light emitting layer (S103).

Then, a metal is laminated on the organic light emitting layer and is etched, thereby forming a cathode and forming an organic light emitting device (S104). Then, a sealant is laminated to complete an organic electroluminescent device.

Such an organic electroluminescent device may be fabricated by performing fabrication processes in a consecutive inline manner by a single roll to roll process line, or by performing some fabrication processes in a consecutive inline manner by a single roll to roll process line. Alternatively, such an organic electroluminescent device may be fabricated in a single inline manner, as a plurality of roll to roll process lines for performing respective processes are assembled to each other.

Figure 2:
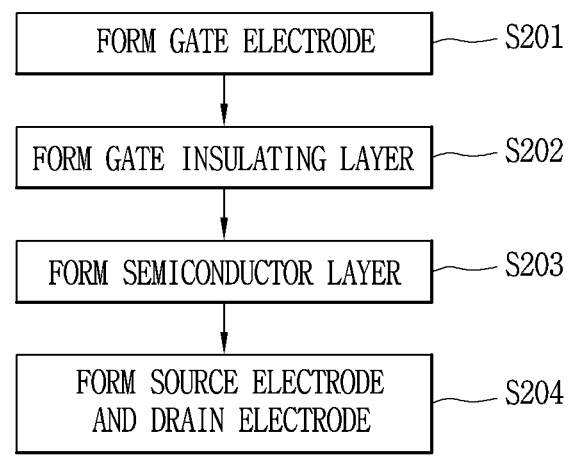
FIG. 2 is a flowchart showing a method for fabricating a thin film transistor (TFTx) of an organic electroluminescent device.

FIG. 2 is a flowchart showing a method for fabricating a thin film transistor (TFT) of an organic electroluminescent device among the fabrication processes shown in FIG. 1.

As shown in FIG. 2, a metallic layer is laminated on a substrate by a deposition method such as sputtering, and then is etched, thereby forming a gate electrode (S201). Then, an inorganic insulating material such as SiOx or SiNx is laminated on the entire substrate where the gate electrode is formed, thereby forming a gate insulating layer (S202). Then, a semiconductor such as an amorphous silicon semiconductor is laminated on the gate insulating layer by a CVD method and is etched, thereby forming a semiconductor layer (S203). Then, a metal is laminated on the semiconductor layer by a sputtering method and is etched, thereby forming a source electrode and a drain electrode and completing a thin film transistor (S204).

In such a TFT forming process, a gate electrode, a source electrode and a drain electrode are formed by blanket deposition, followed by etching a metallic layer through an exposure process. A gate insulating layer and a semiconductor layer are formed by depositing a material through a CVD process and by etching the material. Here, the gate electrode, the source electrode and the drain electrode may be formed by a roll to roll fabrication apparatus for etching a metallic layer, and the gate insulating layer and the semiconductor layer may be formed by a roll to roll fabrication apparatus for CVD. The metallic layer etching step and the CVD step may be executed by a single roll to roll fabrication apparatus.

A plurality of processes of the metallic layer etching step, such as a photoresist lamination process, an exposing process and a metal etching process, may be executed by corresponding roll to roll fabrication apparatuses. Alternatively, the plurality of processes of the metallic layer etching step may be executed by a single consecutive roll to roll fabrication apparatus. Further, a plurality of processes for forming a gate insulating layer and a semiconductor layer by a CVD method may be executed by corresponding roll to roll fabrication apparatuses, or may be executed by a single consecutive roll to roll fabrication apparatus.

In case of performing a plurality of processes through a single roll to roll fabrication process, a corresponding process is performed while a film is being transferred. And if the corresponding process is completed, the film is transferred to another process region by a roll such that a next process is consecutively performed. This may allow all processes to be performed in a single inline manner.

In case of performing a plurality of processes through respective roll to roll fabrication processes, a film is transferred by a transfer apparatus such as a robot arm or an operator, and is supplied to a roll to roll fabrication apparatus. Then, a corresponding process is performed by consecutively transferring the film by the roll to roll fabrication apparatus. If the corresponding roll to roll fabrication process is terminated, the film is re-transferred to a roll to roll fabrication apparatus for a next process by the transfer apparatus or the operator.

Figure 3:
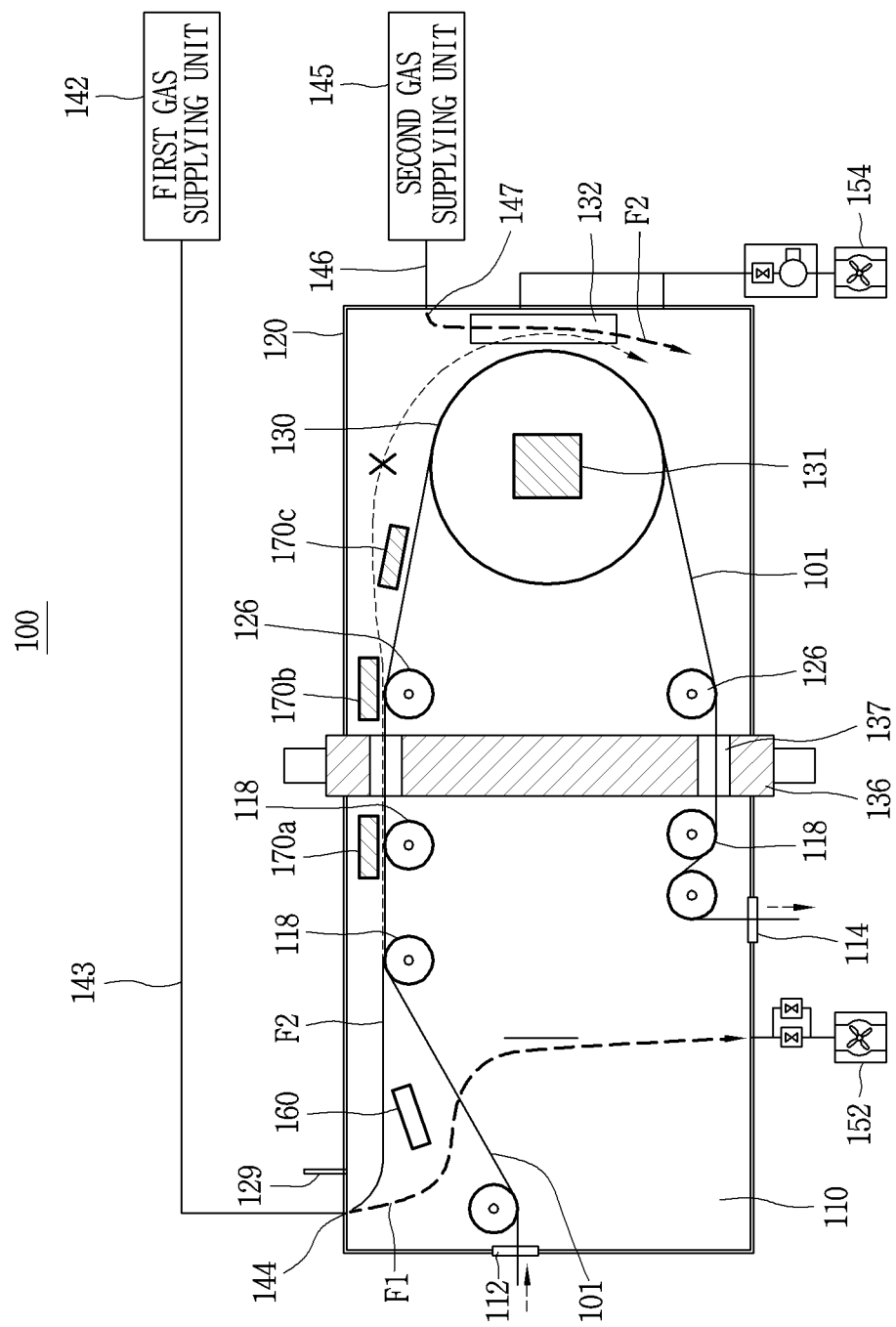
FIG. 3 is a view showing a roll to roll fabrication apparatus according to a first embodiment of the present disclosure.

FIG. 3 is a view showing the roll to roll fabrication apparatus 100 according to a first embodiment of the present disclosure. The roll to roll fabrication apparatus 100 shown in FIG. 3 represents the roll to roll fabrication apparatus 100 for a CVD process. However, the roll to roll fabrication apparatus 100 for a CVD process is similar to a roll to roll fabrication apparatus 100 for other processes. Accordingly, the present disclosure will be explained by taking the roll to roll fabrication apparatus 100 for a CVD process as a representative example.

As shown in FIG. 3, the roll to roll fabrication apparatus 100 performs its function within a vacuum chamber. The vacuum chamber includes an installation chamber 110 where a film 101 is transferred from a previous process region and is transferred to another process region, and a process chamber 120 where a corresponding process is performed on the film.

The installation chamber 110 includes an inlet 112 where the film 101 processed in a previous process is transferred; an outlet 114 where the film 101 processed in a current process is transferred to a next process region; a plurality of first guide rolls 118 configured to guide the film 101 input through the inlet 112 and the film 101 output through the outlet 114; a preprocessing unit 160 disposed at the inlet, configured to wash an organic material on the surface of the film 101 by changing a surface characteristic of the film 101, by preprocessing the film 101 transferred from the installation chamber 110 to the process chamber by plasma, and configured to enhance a deposition characteristic in a CVD process; a first vacuum pump 152 installed at the installation chamber 110, and configured to make the inside of the installation chamber 110 vacuous; and a first heater 170a disposed in the installation chamber 110, and configured to primarily heat the film 101 transferred to the process chamber 120.

The process chamber 120 includes a plurality of second guide rolls 126 configured to guide the film 101 input and output in the installation chamber 110; a process treatment unit 132 configured to substantially perform a process such as a CVD process; a process drum 130 configured to wind the film 101 thereon and to perform a CVD process, etc. on the wound film 101; a second heater 170b and a third heater 170c disposed in the process chamber 120, and configured to secondarily heat and tertiary heat the film 101 wound on the process drum 130, respectively; and a second vacuum pump 154 installed at the process chamber 120, and configured to make the inside of the process chamber 120 vacuous.

A partition wall 136 is disposed between the installation chamber 110 and the process chamber 120, thereby separating the installation chamber 110 and the process chamber 120 from each other. An environment of the installation chamber 110 and the process chamber 120, such as a vacuum state, becomes different by the partition wall 136.

An opening 137 is disposed at the partition wall 136, through which the installation chamber 110 and the process chamber 120 are connected to or separated from each other. The opening 137 is open when the film 101 is transferred from the installation chamber 110 to the process chamber 120, and when the film 101 is transferred from the process chamber 120 to the installation chamber 110. On the other hand, the opening 137 is closed when the film 101 is not transferred, thereby separating the installation chamber 110 and the process chamber 120 from each other.

The vacuum and gas in chambers 110 and 120 can therefore be different from each other. The chamber 110 can be at a medium vacuum state while the chamber 120 can be at a high vacuum state. Similarly, different gasses, as well as different concentrations of various gasses, may be separately provided in each of the chambers 110 and 120. The opening 137 may have an airtight seal that permits the film 101 to move through the opening 137 while preventing transfer of gas or a vacuum between the two chambers. For example, the opening 137 may have a sealing surface, such as a wiper blade, a plastic strip, or other flange, that maintains an airtight seal between the two chambers when the film 101 passes from one chamber into the next. Alternatively, the opening 137 can be made extremely small relative to the thickness of the film 101. It may permit a few molecules of gas to exchange between the two chambers, but the flow is substantially impaired so that the gasses, as well as the vacuum conditions in the two chambers, can be maintained separately.

In one embodiment, when the film 101 is not passing between chamber 110 and 120, the opening 137 can be closed in order to maintain the isolation from the two chambers 110 and 120.

The inlet 112 and the outlet 114 of the installation chamber 110 are installed to be open and closed. When a previous process for a first film 101 is terminated, and the film has left the chamber by the outlet 114, the inlet 112 is open such that a new film 101 is transferred from a previous process region through the inlet 112. If the current film 101 is completely transferred, the inlet 112 is closed such that an inner environment of the installation chamber 110 (e.g., a vacuum state) is shielded from the outside, i.e., an environment of the previous fabrication apparatus.

If a process of the roll to roll fabrication apparatus 100 (i.e., a CVD process) is terminated, the outlet 114 is open, and the film 101 having undergone a process is transferred to a roll to roll fabrication apparatus that is outside the chamber 110 (not shown), for a next process, through the outlet 114.

The preprocessing unit 160 processes the surface of the film 101 input through the inlet 112 by plasma, thereby removing foreign materials such as an organic material which remains on the surface of the film 101, and enhancing a surface characteristic of the film 101. This may allow a deposition material to be easily deposited on the surface of the film 101 in a subsequent CVD process, thereby preventing a layer formed on the surface of the film 101 from floating.

As shown in FIG. 3, a first gas supplying unit 142 is connected to the installation chamber 110, thereby supplying oxygen or nitrogen into the installation chamber 110 through a first gas supplying pipe 143 and a first gas inlet 144. The preprocessing unit 160 makes the supplied oxygen or nitrogen be in a plasma state, and then processes the surface of the film 101 which is transferred. In one embodiment, the surface of the film 101 is processed to be hydrophilic by plasma, for example. This may prevent a layer formed in a subsequent CVD process from floating on the layer 101 or moving.

Figure 4A:
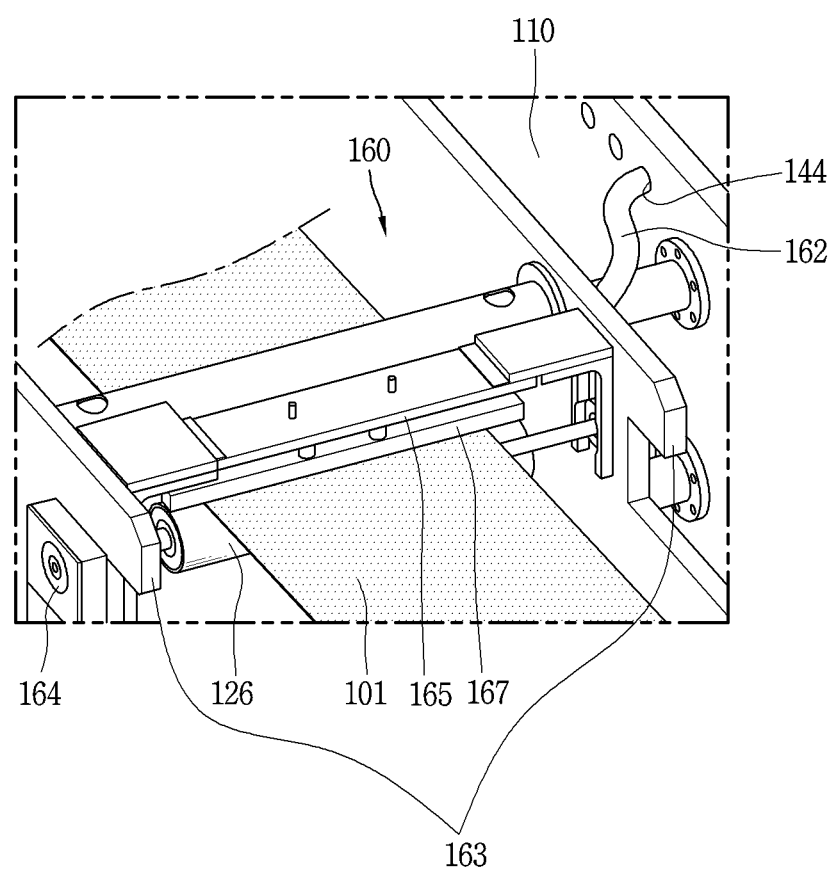
FIGS. 4A and 4B are views showing a preprocessing unit of the roll to roll fabrication apparatus of FIG. 3.

FIG. 4A is a partial enlargement view showing the preprocessing unit 160 in more detail.

As shown in FIG. 4A, the preprocessing unit 160 includes guide bars 163 attached to the installation chamber 110, and disposed at both sides of a transfer path of the film 101 which is transferred by the guide rolls 126; a supporting plate 165 disposed above the film 101, and coupled to the guide bars 163 by coupling members 164; a plasma injection plate 167 attached to the supporting plate 165, and configured to process the film 101 by making gas injected into the film 101 into a plasma state and then by injecting the plasma gas; and a gas injection pipe 162 connected to the first gas inlet 144 formed at the installation chamber 110, and configured to inject gas into the plasma injection plate 167.

In the preprocessing unit 160, since the plasma injection plate 167 for injecting plasma is disposed above the film 101 which is transferred, plasma is directly injected onto the surface of the film 101 to process the surface of the film 101, thereby enhancing the quality of a layer formed on the film 101. The type of preprocessing of the film 101 to be carried out is variable according to a process requiring a corresponding roll to roll fabrication apparatus. However, in case of a CVD process, the surface of the film 101 may be processed to be hydrophilic such that a deposition material may be easily deposited on the surface of the film 101. The preprocessing may or may not include a plasma.

Figure 4B:
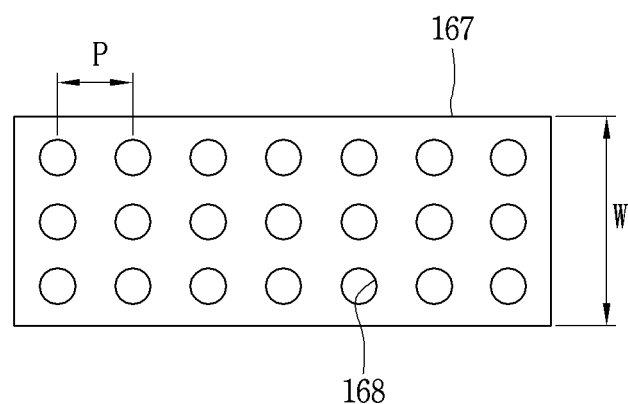

FIG. 4B is a view showing the plasma injection plate 167 shown in FIG. 3. As shown in FIG. 4B, the plasma injection plate 167 is formed in a quadrangular shape, and a plurality of injection openings 168 are formed to inject plasma onto the film 101. A width (w) of the plasma injection plate 167 is formed to be equal to or larger than that of the film 101 which is transferred, such that plasma injected from the plasma injection plate 167 is injected onto the entire surface of the film 101 at a preprocessing region.

The injection openings 168 are arranged at the plasma injection plate 167 with a predetermined pitch (p) therebetween. Here, the pitch (p) of the injection openings 168 is determined according to a distance between the plasma injection plate 167 and the film 101, and an injection angle of plasma injected from the injection openings 168.

Referring to FIG. 3 again, the film 101 wound on the process drum 130 disposed in the process chamber 120 is transferred to the process treatment unit 132, and a process such as a CVD process is performed at the process treatment unit 132. A second gas supplying unit 145 is connected to the process chamber 120, thereby supplying mixed gas of $SiH_4$ and $N_2O$ or mixed gas of $SiH_4$, $NH_3$ and $N_2$, through a second gas supplying pipe 146 and a second gas inject 147. The process treatment unit 132 performs a CVD process by making the supplied gas be in a plasma state. For instance, in case of forming an insulating layer formed of $SiO_2$, mixed gas of $SiH_4$ and $N_2O$ is supplied into the process chamber 120 for a CVD process. In case of forming an insulating layer formed of SiNx, mixed gas of $SiH_4$, $NH_3$ and $N_2$ is supplied into the process chamber 120 for a CVD process.

The CVD process by the process drum 130 and the process treatment unit 132 is performed in a state that the film 101 is being supported on circular surface of the process drum 130. Here, the CVD process may be performed while the film 101 is in a stopped state as a rotation of the process drum 130 is stopped. Alternatively, the CVD process may be performed while the film 101 is being transferred at a low speed as the process drum 130 is rotated at a low speed.

In the aforementioned descriptions, a CVD process is performed by the process treatment unit 132. However, the process treatment unit 132 of the present disclosure may perform various processes (e.g., a metal deposition process) as well as such a CVD process.

Since a CVD process is performed at a temperature of about 200-250° C., the film 101 should be heated to a temperature of about 200-250° C. such that the CVD process is performed on the film 101. For this, the process drum 130 is provided with a process heater 131 to heat the film 101 wound on the process drum 130.

The installation chamber 110 is provided with a first heater 170a, and the process chamber 120 is provided with a second heater 170b and a third heater 170c. The first to third heaters 170a, 170b, 170c are arranged near a transfer path of the film 101, and heat the film 101 which is transferred to increase a temperature of the film 101 before the film 101 is wound on the process drum 130. The reason why the temperature of the film 101 is increased is as follows.

A CVD process is performed at a temperature of about 200-250° C., and the film 101 wound on the process drum 130 is heated to a temperature of about 200-250° C. by the process heater 131 provided at the process drum 130. However, in case of suddenly heating the film 101 at a high temperature of about 200-250° C., from a room temperature, a stress may occur on the film 101 by a thermal impact and wrinkles may occur on the film 101. The wrinkles occurring on the film 101 prevents the film 101 from being used as a substrate of a display device, and prevents a specific film formed by a CVD process from having a uniform surface.

In order to solve such problems, in the present disclosure, the heaters 170a, 170b, 170c are provided to gradually increase a temperature of the film 101 and then to wind the film 101 onto the high-temperature process drum 130, thereby preventing a thermal impact from being applied to the film 101. Especially, in the present disclosure, the plurality of heaters 170a, 170b, 170c are provided to slowly increase the temperature of the film 101 step by step, or gradually, thereby preventing an inferiority due to a thermal impact. That is, in the present disclosure, the film 101 which is transferred is heated to a temperature of about 100° C. by the first heater 170a, the film 101 is heated to a temperature of about 150° C. by the second heater 170b, and the film 101 is heated to a temperature of about 180° C. by the third heater 170c. Accordingly, even if the film 101 heated to a temperature of about 180° C. is wound on the process drum 130 having a temperature of about 200-250° C., a temperature difference between the process drum 130 and the film 101 wound on the process drum 130 is not great (about 20-70° C.). As a result, a thermal impact is not applied to the film 101.

Figure 5:
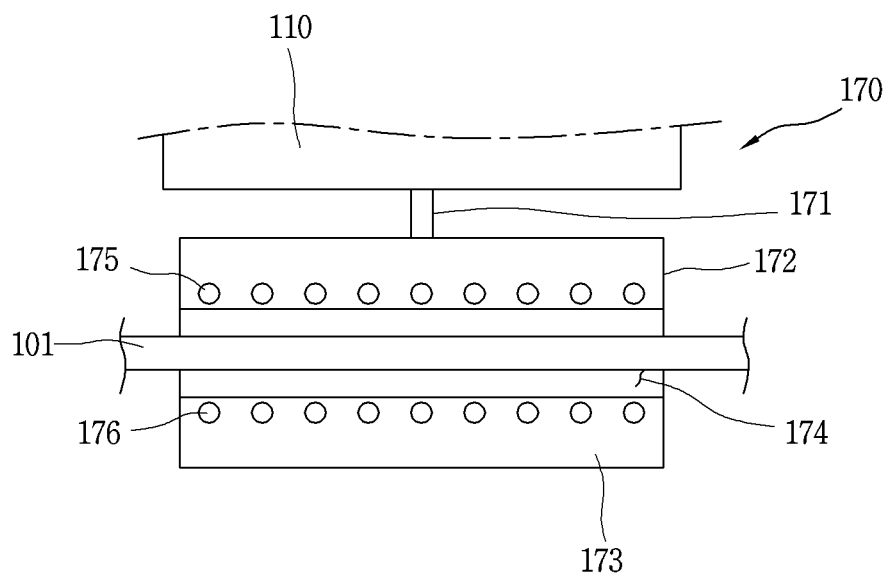
FIG. 5 is a view showing a heat processing unit of the roll to roll fabrication apparatus of FIG. 3.

FIG. 5 is a view schematically showing a structure of the first to third heaters 170 of the roll to roll fabrication apparatus according to the present disclosure.

As shown in FIG. 5, the heater 170 includes a body 172 attached to the installation chamber 110 or the process chamber 120 by a connection portion 171, and having therein a transfer path 174 along which the film 101 is transferred; and a plurality of first infrared ray lamps 175 arranged at an upper side of the transfer path 174 inside the body 172 in one line, and a plurality of second infrared ray lamps 176 arranged at a lower side 173 of the transfer path 174 in one line.

When the film 101 is transferred along the transfer path 174 inside the heater 170, the first and second infrared ray lamps 175, 176 are turned on to heat the film 101 transferred toward a process lamp 130. Here, in the drawings, the first and second infrared ray lamps 175, 176 are arranged at upper and lower sides of the body 172 to heat upper and lower surfaces of the film 101. However, it is possible that the infrared ray lamps are arranged at one of the upper and lower sides to heat only the upper surface or the lower surface of the film 101.

Referring to FIG. 3 again, the first heater 170a is arranged at the installation chamber 110, and the second and third heaters 170b, 170c are arranged at the process chamber 120. However, all of the heaters 170a, 170b, 170c may be arranged at the installation chamber 110 or at the process chamber 120. Each of the installation chamber 110 and the process chamber 120 may be provided with one heater or a plurality of heaters. Alternatively, two heaters 170a, 170b may be arranged at the installation chamber 110, and one heater 170c may be arranged at the process chamber 120.

The heaters 170a, 170b, 170c heat the film 101 wound on the high-temperature process drum 130 to increase the temperature of the film 101 step by step or gradually, thereby preventing application of a thermal impact to the film 101 due to the high-temperature process drum 130. Accordingly, the heaters may have any configuration if it can increase the temperature of the film 101 gradually. For instance, the heaters 170a, 170b, 170c may be provided in more than 4, not in 3, in order to more gradually increase the temperature of the film 101.

Further, in order to prevent lowering of the temperature of the film 101 heated by the heaters 170a, 170b, 170c while the film 101 is being transferred to the process drum 130, the heaters 170a, 170b, 170c are preferably arranged near the process drum 130 to the maximum.

As the first vacuum pump 152 is connected to the installation chamber 110 and the second vacuum pump 154 is connected to the process chamber 120, the installation chamber 110 and the process chamber 120 maintain a vacuum state of different levels. Here, the installation chamber 110 and the process chamber 120 are connected to each other by the opening 137 of the partition wall 136. In case of performing a CVD process at the process chamber 120, the opening 137 is closed, and the process chamber 120 is made to be in a set vacuum state by a second chamber 154.

Once the CVD process is terminated, the opening 137 is open such that the film 101 formed by the CVD process is transferred to the installation chamber 110 through the opening 137. In case of transferring the film 101 to a next process region after the corresponding process is terminated, the opening 137 of the partition wall 136 is closed such that the process chamber 120 is shielded from the outside. In this case, the outlet 114 of the installation chamber 110 is open to permit the film 101 to be consecutively transferred to a roll to roll fabrication apparatus that is outside chamber 110 for a next process, by passing it through the open outlet 114.

The first and second vacuum pumps 152, 154 are used to make the installation chamber 110 and the process chamber 120 vacuous. In one embodiment, one vacuum pump may be provided at the installation chamber 110 and the process chamber 120 to make the installation chamber 110 and the process chamber 120 vacuous. However, two vacuum pumps 152, 154 are preferably used in the present disclosure due to the following reasons.

In case of arranging a single vacuum pump at the roll to roll fabrication apparatus, the vacuum pump is preferably arranged at the process chamber 120. That is, only the second vacuum pump 154 is arranged at the process chamber 120, because a vacuum state of the process chamber 120 where a CVD process is substantially performed should be controlled precisely. In this case, the installation chamber 110 is formed to be in a vacuum state, as air is discharged to the second vacuum pump 154 through the opening 137 of the partition wall 136 when the second vacuum pump 154 is driven.

In the embodiment in which a single pump 154 is used, the opening 137 is designed to permit gas to pass therethrough. The opening is made sufficiently large that a vacuum can be pumped in chamber 110 by removing air from chamber 120 and drawing the air through openings 137. Thus, this is an acceptable technique according to one embodiment.

However, the roll to roll fabrication apparatus where the installation chamber 110 and the process chamber 120 are made to be in a vacuum state by the second vacuum pump 154, has the following shortcomings.

In the installation chamber 110, the film 101 has its surface plasma-processed by the preprocessing unit 160, thereby enhancing its surface characteristic. For this, oxygen or nitrogen for plasma-processing is supplied to the installation chamber 110. However, in the roll to roll fabrication apparatus where the installation chamber 110 and the process chamber 120 are made to be in a vacuum state only by the second vacuum pump 154, the oxygen or nitrogen for plasma-processing supplied to the installation chamber 110 passes through the installation chamber 110 and the process chamber 120 along a second flow path (F2) shown in FIG. 3, and then is discharged to the outside through the second vacuum pump 154.

In the process chamber 120, a CVD process is performed as mixed gas of $SiH_4$ and $N_2O$ or mixed gas of $SiH_4$, $NH_3$ and $N_2$ is in a plasma state. However, in the case where oxygen or nitrogen supplied to the installation chamber 110 is discharged to the outside along the second flow path (F2), the oxygen or nitrogen is mixed with the mixed gas of $SiH_4$ and $N_2O$ or the mixed gas of $SiH_4$, $NH_3$ and $N_2$ within the process chamber 120. This may cause an inferiority to occur when a film of $SiO_2$ or SiOx is formed by a CVD process.

In the present disclosure, since the first and second vacuum pumps 152, 154 are arranged at the installation chamber 110 and the process chamber 120, respectively, preprocessing gas supplied to the installation chamber 110 is not discharged to the second vacuum pump 154 along the second flow path (F2), but is discharged to the outside only through the first vacuum pump 152 along a first flow path (F1). As preprocessing plasma gas is not mixed with processing plasma gas, an inferior film due to gas mixing may be prevented.

Preprocessing plasma gas flows to the first vacuum pump 152 from the first gas inlet 144 within the installation chamber 110, and is discharged to the outside. Accordingly, the preprocessing unit 160 is preferably arranged near the first gas inlet 144 or near the first flow path (F1), such that preprocessing plasma gas is prevented from being introduced into the process chamber 120.

Accordingly, in the alternative embodiment, the opening 137 is designed to permit little or no exchange of gas between chambers 110 and 120. This will prevent the preprocessing plasma gas molecules from entering the chamber 120. It will also permit a separate level of vacuum to be obtained in the chambers 110 and 120. As can be expected, in some situations, the vacuum pressure in the preprocessing chamber 110 will be different than the desired vacuum pressure in the CVD chamber 120. Normally, the CVD chamber requires a relatively low pressure environment, and a higher vacuum will usually be required in the CVD chamber 120 than is required in the preprocessing chamber 110. By using separate vacuum pumps and separate chambers that are hermetically sealed relative to each other, the desired gas pressure in each chamber can be more accurately obtained.

Hereinafter, a method of forming a film by a CVD process in the roll to roll fabrication apparatus shown in FIG. 3 will be explained with reference to FIG. 6.

Figure 6:
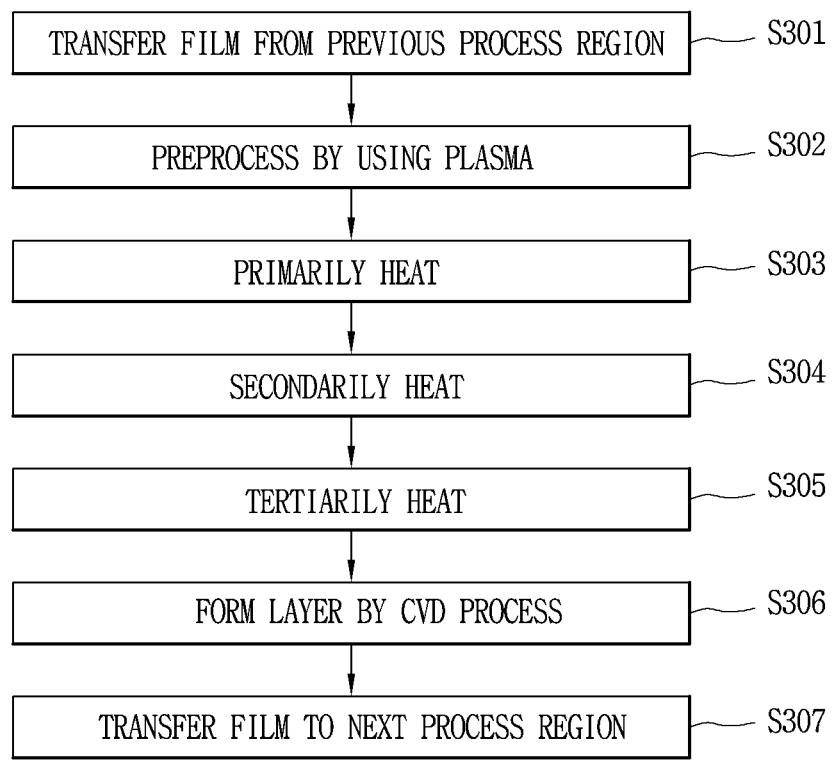
FIG. 6 is a flowchart showing fabrication processes using the roll to roll fabrication apparatus of FIG. 3.

As shown in FIG. 6, if a previous process (e.g., a metal patterning process) is terminated, the inlet 112 of the installation chamber 110 is open such that the film 101 having a metallic pattern, etc. by the previous process is transferred (S301).

Then, the preprocessing unit 160 disposed in the installation chamber 110 makes oxygen and nitrogen supplied from the outside be in a plasma state to process the surface of the film 101, thereby cleaning the surface of the film 101 and enhancing a surface characteristic of the film 101 (S302).

Then, the film 101 is heated by at least one first heater 170a disposed at the installation chamber 110. Here, the film 101 may have its temperature increased to about 100° C. through a primary heating. Alternatively, a plurality of heaters may be disposed within the installation chamber 110 to secondarily and tertiary heat the film 101 to a temperature of more than 100° C.

Then, the opening 137 of the partition wall 136 between the installation chamber 110 and the process chamber 120 is open such that the heated film 101 is transferred to the process chamber 120. And the film 101 is heated again by the second heater 170b disposed at the process chamber 120 (S304). Here, the temperature of the film 101 is increased up to 150° C. However, the temperature of the film 101 according to the present disclosure is not limited to such a specific temperature.

Then, the film 101 is transferred in the process chamber 120, and then is heated again by the third heater 170c (S305). Here, the temperature of the film 101 is increased up to 180° C. However, the temperature of the film 101 is not limited to such a specific temperature. While the film 101 is being heated within the process chamber 120, the opening 137 of the partition wall 136 is closed.

Then, the heated film 101 is wound on the process drum 130, and then a CVD process is performed by the process treatment unit 132, thereby forming a layer on the film 101 (S306). Here, the layer formed on the film 101 by the CVD process may be an inorganic layer or a semiconductor layer.

Next, the opening 137 of the partition wall 136 is open such that the formed film 101 is transferred to the installation chamber 110, and then the film 101 is transferred to a roll to roll fabrication apparatus for a next process, through the outlet 114 of the installation chamber 110 (S307).

As aforementioned, in the present disclosure, the film 101 is wound on the process drum 130, and the plurality of heaters gradually heat the film 101 to a temperature close to a CVD process temperature before a CVD process is performed. This may prevent application of a thermal impact to the film 101 due to a drastic temperature change. As a result, wrinkles occurring on the film 101 due to a thermal impact may be prevented, and an inferior film due to such wrinkles may be prevented.

Further, in the present disclosure, the preprocessing unit 160 is provided at the installation chamber 110 to process the surface of the film 101 by plasma, thereby preventing a film formed in the installation chamber 120 from floating.

Moreover, in the present disclosure, the first vacuum pump 152 and the second vacuum pump 154 are provided at the installation chamber 110 and the process chamber 120, respectively, such that gas used to preprocess the film 160 is discharged to the outside while flowing only in the installation chamber 110, without being discharged to the process chamber 120. This may prevent an inferior CVD process resulting from mixing of preprocessing plasma gas with plasma gas for CVD in the process chamber 120.

Figure 7:
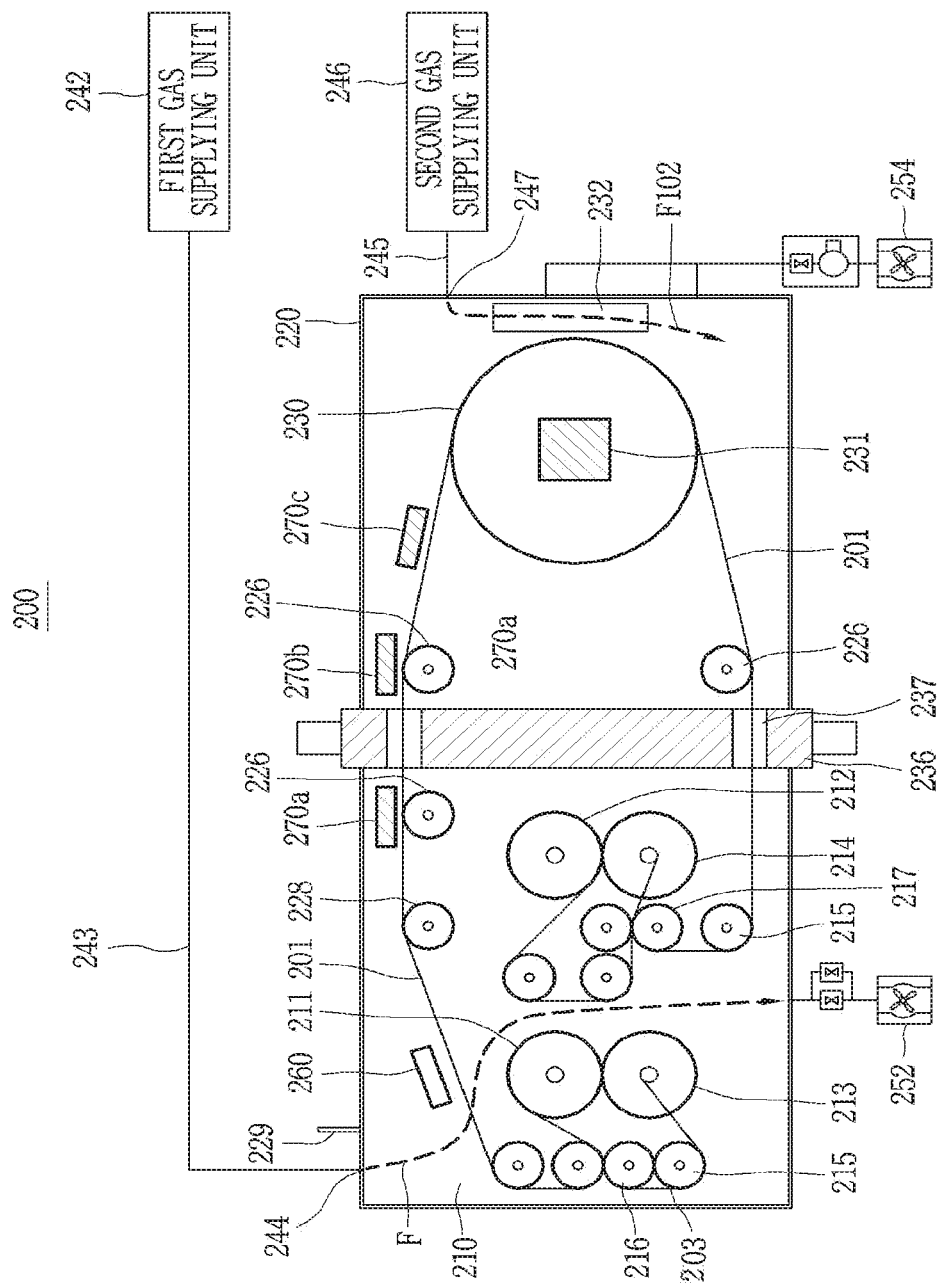
FIG. 7 is a view showing a roll to roll fabrication apparatus according to a second embodiment of the present disclosure.

FIG. 7 is a view showing a roll to roll fabrication apparatus according to a second embodiment of the present disclosure. The roll to roll fabrication apparatus according to this embodiment is similar to that shown in FIG. 3. In the roll to roll fabrication apparatus shown in FIG. 3, all processes are consecutive inline roll to roll processes, and each of the roll to roll processes is connected to a previous process and a next process. Namely, in the apparatus as shown in FIG. 3, the film 101 was previously on a different roll and was involved in a different process, which was a separate roll to roll fabrication process using a different roll to roll fabrication apparatus.

On the other hand, the roll to roll fabrication apparatus according to the embodiment of FIG. 7 is a roll to roll process which is disconnected from a previous process and a next process.

The roll to roll fabrication apparatus according to the embodiment of FIG. 7 has the same basic structure as the roll to roll fabrication apparatus shown in FIG. 3, except for a structure of an installation chamber 210. Hereinafter, the same structure will not be explained or will be explained only in brief, and those structures that are a different structure will be explained in more detail.

As shown in FIG. 7, the installation chamber 210 includes a film supplying roll 211 for supplying a film 201, a film collecting roll 212 for collecting the film 201 which has undergone a CVD process in a process chamber 220, a protection film separating roll 216 for separating a protection film 203 from the film 201 wound on the film supplying roll 211, a protection film collecting roll 213 for collecting the protection film 203 separated from the film 201 by the protection film separating roll 216, a protection film supplying roll 217 for supplying the protection film 203, and a protection film attaching roll 217 for attaching the protection film 203 supplied from the protection film supplying roll 217 to the film 201 which has undergone a CVD process in the process chamber 220.

Since the roll to roll fabrication apparatus according to this embodiment performs a roll to roll process disconnected from a previous process and a next process, it is not provided with an inlet and an outlet for transferring the film 201 in real time and consecutively from a previous process region to a next process region, unlike the roll to roll fabrication apparatus shown in FIG. 3.

In the roll to roll fabrication apparatus according to the embodiment of FIG. 7, the film 201 having undergone a process in a previous fabrication process is transferred by a transfer device such as a robot arm or an operator, and is directly supplied to the installation chamber 210. Since the film 201 is transferred in a state that the protection film 203 has been attached thereon, contamination or damages of a process surface of the film 203 due to an external condition, etc. may be prevented when the film 203 is transferred. Further, only the film 201 having undergone a previous process may be supplied to a roll to roll fabrication apparatus for a corresponding process to thus be wound on the film supplying roll 211. Alternatively, not only the film 201 having undergone a previous process, but also a roll on which the film 201 has been wound may be transferred together, so the roll on which the film 201 has been wound may be directly installed in the installation chamber 210.

Here, the transferred roll serves as the film supplying roll 211 of the roll to roll fabrication apparatus.

Since the film 201 having undergone a previous process has the protection film 203 attached thereon, the protection film 203 is separated by the protection film separating roll 216, and then the film 201 is transferred to the process chamber 220. Here, the separated protection film 203 is collected in a wound state on the protection film collecting roll 213.

The film 201 having the protection film 203 separated therefrom undergoes a surface process by a preprocessing unit 260, and then is transferred to the process chamber 220 through an opening 237 of a partition wall 236.

Since a first vacuum pump 252 and a second vacuum pump 254 are provided at the installation chamber 210 and the process chamber 220, respectively, preprocessing plasma gas supplied to the installation chamber 210 is not introduced into the process chamber 220. This may prevent an inferior CVD process resulting from mixing of preprocessing plasma gas with plasma gas for CVD.

A plurality of heaters 270a, 270b, 270c are provided at the installation chamber 210 and the process chamber 220, thereby gradually increasing a temperature of the film 201 wound on a process drum 230. This may prevent a thermal impact of the film 201 due to the high-temperature process drum 230.

The protection film 203 is attached onto a surface of the film 201 having undergone a CVD process in the process chamber 220. Then, the film 201 having the protection film 203 thereon is wound on the film collecting roll 212, and is collected.

Once the film 201 is collected, the installation chamber 210 is bent to implement an atmospheric pressure state. Then, the collected film 201 or the film collecting roll 212 on which the film is wound, is extracted from the installation chamber 210 and is transferred to a roll to roll fabrication apparatus for a next process. As a CVD process is terminated, a next process is performed.

In the aforementioned descriptions, a specific configuration of the present disclosure has been explained. However, the present disclosure is not limited to such a specific configuration, but may include various modifications.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A roll to roll fabrication apparatus performing a plurality of processes through a single roll to roll fabrication process, comprising:
a vacuum chamber having an installation chamber and a process chamber, wherein the installation chamber is configured to preprocess a film and the process chamber is configured to process the film after the preprocessing by the installation chamber, the film having a first surface and a second surface that is opposite of the first surface, and wherein the installation chamber includes an inlet where the film processed in a previous process is transferred and an outlet where the film processed in a current process is transferred to a next process region;
an opening installed between the installation chamber and the process chamber;
a preprocessing device arranged in the installation chamber, the preprocessing device having a plasma gas injection plate and a plurality of injection openings in the plasma gas injection plate, the preprocessing device configured to inject plasma gas on the first surface of the film via the plurality of injection openings to remove foreign materials on the first surface of the film to be transferred, wherein the injection openings have a selected pitch therebetween along a first direction of the plasma gas injection plate and a second direction of the plasma gas injection plate that is transverse to the first direction;
a process drum in the process chamber to wind the film thereon;
a gas supply configured to inject gas through a gas supplying pipe in the process chamber, the gas supply being configured to form the gas in a plasma state and perform a chemical vapor deposition process on the film wound on the process drum based on the plasma state of the gas;
a first vacuum pump and a second vacuum pump arranged at the installation chamber and the process chamber, respectively,
wherein the plasma gas flows to the first vacuum pump from a first gas inlet within the installation chamber, and the preprocessing device is arranged near the first gas inlet, such that the plasma gas is prevented from being introduced into the process chamber, and
wherein the opening is configured to prevent the plasma gas from entering the process chamber and to maintain separate vacuum levels to be obtained in the installation chamber and the process chamber;
at least one first heater in the installation chamber, wherein the first heater gradually increases a temperature of the film to within a first range;
at least one second heater, which is disposed in the process chamber and between the at least one first heater and the process drum, wherein the second heater gradually increases the temperature of the film from within the first range to within a second range higher than the first range,
wherein the preprocessing device further includes:
guide bars attached to the installation chamber and disposed at both sides of a transfer path of the film which is transferred by guide rolls; and
a supporting plate disposed above the film and coupled to the guide bars;
wherein the plasma gas injection plate is attached to the supporting plate, and configured to process the film by turning gas injected into the film into a plasma state and then by injecting the plasma gas; and
a gas supplying pipe is connected to the first gas inlet formed at the installation chamber and configured to inject gas into the plasma gas injection plate.

2. The roll to roll fabrication apparatus of claim 1, wherein the first and second heaters each include:
a first infrared ray lamp; and a second infrared ray lamp arranged to face the first infrared ray lamp,
wherein the first infrared ray lamp is configured to apply heat to the first surface of the film, and the second infrared ray lamp is configured to apply heat to the second surface of the film opposite of the first surface.

3. The roll to roll fabrication apparatus of claim 1, further comprising a process heater within the process drum, wherein the process heater gradually increases the temperature of the film from within the second range to within a third range higher than the second range.

4. The roll to roll fabrication apparatus according to claim 3, wherein the third range is between 200° C. and 250° C.

5. The roll to roll fabrication apparatus according to claim 1, wherein the first range is between 20° C. (Celsius) and 100° C.

6. The roll to roll fabrication apparatus according to claim 1, wherein the second range is between 100° C. and 180° C.

\* \* \* \* \*